(12) United States Patent
Bradbury-Harris et al.

(10) Patent No.: US 6,395,120 B1
(45) Date of Patent: May 28, 2002

(54) HOT DIELESS FOILING

(75) Inventors: Graeme William Bradbury-Harris, Manchester; James Clifford Kelly, Edinburgh, both of (GB)

(73) Assignee: API Foils Limited, Livingston (GB)

( * ) Notice: Subject to any disclaimer, the term of this patent is extended or adjusted under 35 U.S.C. 154(b) by 0 days.

(21) Appl. No.: 09/274,606

(22) Filed: Mar. 23, 1999

(30) Foreign Application Priority Data

Mar. 23, 1998 (GB) .............................. 9806212

(51) Int. Cl.⁷ ..................... B44C 1/165; B32B 31/20; B32B 7/06; B41M 3/12; B41M 3/14
(52) U.S. Cl. ............. 156/230; 156/233; 156/234; 156/238; 156/241; 156/247; 156/277; 156/287; 427/146; 427/147; 427/148; 428/209; 428/914; 428/915
(58) Field of Search .............. 156/230, 233, 156/234, 240, 241, 247, 277, 289; 427/146, 147, 148; 428/195, 200, 201, 209, 914, 915

(56) References Cited

U.S. PATENT DOCUMENTS

| 4,465,538 A | * | 8/1984 | Schmoock | 156/233 |
| 4,724,026 A | * | 2/1988 | Nelson | 156/233 |
| 5,520,973 A | * | 5/1996 | Kamen et al. | 428/35.7 |
| 5,565,054 A |   | 10/1996 | Lappe et al. | |
| 5,603,259 A | * | 2/1997 | Gross et al. | 101/33 |
| 5,735,994 A |   | 4/1998 | Lappe et al. | |

FOREIGN PATENT DOCUMENTS

| DE | 4110801 C1 | 5/1992 |
| EP | 0195857 | 10/1986 |
| GB | 0569520 | 1/1996 |
| JP | 10241461 | 9/1998 |
| WO | PCT/FR92/00074 | 8/1992 |
| WO | PCT/DE92/00275 | 10/1992 |

* cited by examiner

Primary Examiner—Richard Crispino
Assistant Examiner—J. A. Lorengo
(74) Attorney, Agent, or Firm—Reising, Ethington, Barnes, Kisselle, Learman & McCulloch, PC

(57) ABSTRACT

A process for the application of a pigmented or metallic layer from a foil to a substrate comprising: (i) applying an adhesive to the substrate; (ii) curing the adhesive; (iii) heating the substrate bearing the cured adhesive to render the adhesive tacky; and (iv) transferring the pigmented or metallic layer from the foil to the adhesive-bearing areas of the substrate.

13 Claims, 2 Drawing Sheets

HOT DIELESS FOILING

BACKGROUND OF THE INVENTION

The present invention relates to a method and apparatus for the application of a metallic (or pigmented) layer from a foil to a substrate, and an adhesive that is suitable for use in this technique.

In the printing industry, foils are used to enable the application of a metallic (or pigmented) layer to a substrate (i.e. a surface to be printed).

A foil is a laminated product of comprising a metallic layer or a pigmented layer and an adhesive layer on the underside of the metallic or pigmented layer, which is carried on a plastics carrier layer, for example of polyester. Usually, a thin film of release agent is interposed between the plastics carrier layer and the metallic or pigmented layer to thereby facilitate separation of the metallic or pigmented layer from the carrier layer after adhesion of the metallic or pigmented layer to the substrate has taken place.

Several techniques for the application of the metallic or pigmented layer to the substrate exist. One of the most common techniques for the application of the metallic or pigmented layer to the substrate is known as hot-stamping. According to this technique, the foil is applied to the substrate to be printed and is subjected to the simultaneous application of heat and pressure by a heated, engraved die. This causes activation of the adhesive layer and the release layer of the foil and results in firm adhesion of the metallic layer to the substrate being printed. The carrier layer can then readily be removed from the printed surface, leaving the metallic or pigmented layer firmly adhered to the printed surface.

The metallic or pigmented design applied to the substrate is dictated by the design engraved into the metallic die. It takes approximately ten days to engrave a die with the design, and to mount the die onto the printing press ready for application of the metallic or pigmented image to the substrate. The amount of time it takes to engrave the die results in increased operating costs. In addition, this method is disadvantageous in that the speed at which the printing press may be operated is fairly low, since it takes time to raise the temperature of the foil by the application of heat and pressure from the engraved metallic die to be sufficiently high to effect adhesion and separation of the metallic layer from the carrier layer to the substrate to be printed.

In order to overcome the disadvantages of this process, an alternative transfer technique known as "dieless foiling" has been developed. Two typical arrangements for dieless foiling are illustrated in FIG. 1. According to this technique, adhesive is applied to the substrate using flexographic, lithographic or letter press techniques, so that the coverage of adhesive on the substrate corresponds to the metallic image desired to be transferred. This adhesive is applied as a wet formulation to the substrate, and is subsequently activated (rendered tacky) by one of several physical or chemical changes to the adhesive. The most common technique used to activate the adhesive involves irradiation with ultra-violet light which results in polymerisation of the adhesive components. An alternative method involves combinations of evaporation or oxidation of the applied adhesive. In the case of ultra-violet activation, the ultra-violet light initiates polymerisation of the monomer components in the adhesive.

In the time it takes the adhesive to pass through a tacky state and to cure, the substrate is passed through a foiling station in which a roll of foil is applied to the surface of the substrate and pressed against the adhesive. The distance between the UV drying station and the foiling station is critical in achieving adequate transfer and adhesion of the metallic or pigmented layer from the foil to the substrate. If the distance is too small, the adhesive will not be sufficiently tacky to adhere to the metallic layer of the foil. If the distance is too great, the adhesive will have completely cured and cannot be "reactivated".

In addition, according to this technique it is not possible for components of the printing apparatus to impinge on the side of the substrate to which the adhesive has been applied between the UV drying station and the foiling station, since this would result in the adhesive being transferred to this component. For instance, it is not permissible for the path of the substrate to pass around a turning or rotating roller to redirect the pathway of the substrate towards the foiling station after the UV drying station. Various printing presses in existence prior to the development of dieless foiling did not contain turner bars or rotating rollers in the pathway between a UV drying station and a foiling station, and therefore could be simply modified to be operated in accordance with the dieless foiling technique. For these printing presses, this has not accordingly been a problem.

There are a number of advantages associated with dieless foiling techniques. Much finer resolution of the metallic image on the substrate can be obtained compared to the hot-foiling technique. Standard techniques for the application of inks to the substrate are used for the application of the adhesive to the substrate and consequently a metallic or pigmented image of finer resolution is available. In addition, since the foil and substrate are pressed together through pinch rollers having a smooth, cool surface in contrast to the hot-stamping technique, there is no physical bending of the substrate as it passes through the rollers.

However, not all printing presses that are currently set up for hot-stamping of a metallic or pigmented image to a substrate can be modified simply by the known methods to be usable in a cold dieless foiling method. The known dieless foiling techniques of the prior art are dependent on there being no physical obstruction to the pathway of the substrate between the UV drying station and the foiling station. However, in many existing hot-stamping foiling printing presses, a turner roller or the like is located between the UV drying station which effects drying of the ink supplied to the substrate, and the foiling station. If an adhesive is applied in an adhesive printing station and is activated by initiating cure at the UV station, the tacky adhesive will pass over the turner roller and will be removed from the substrate, thereby making it impossible to apply a metallic image to the substrate by the dieless foiling technique.

The replacement of a printing apparatus with one that does not have a turner roller is a very expensive option, and when compared to the relatively smaller cost savings of conducting the foiling operation using the dieless foiling technique, it is often not an economically viable option. Accordingly, there is a need for a dieless foiling technique that overcomes these problems.

SUMMARY OF THE INVENTION

According to the present invention there is provided a process for the application of a pigmented or metallic layer from a foil to a substrate comprising:

(i) applying an adhesive to the substrate;

(ii) curing the adhesive;

(iii) heating the substrate bearing the cured adhesive to render the adhesive tacky; and (iv) transferring the pigmented or metallic layer from the foil to the adhesive-bearing areas of the substrate.

By using an adhesive that can be cured to an extent that it is not tacky such that the surface of the substrate bearing the adhesive can be passed over components of the printing apparatus, but that can be softened and rendered tacky by the application of heat, it is possible for existing printing processes having turner bars or the like between curing stations and foiling stations to be used in a dieless foiling technique.

Preferably, in step (ii), the adhesive is cured to the extent that the cured adhesive is not transferred to any components of the apparatus upon which the process is conducted that impinge on the pathway of the substrate between the curing step and the heating step.

Whilst any means of curing the adhesive can be used, depending on the adhesive composition including solvent or water evaporation, it is preferred that the curing step be effected by irradiation with ultra-violet light.

Preferably, steps (iii) and (iv) are conducted substantially simultaneously, for example by passing the substrate and foil through a heated laminating nip which effects heating of the adhesive to render the adhesive tacky and which effects the transfer of the pigmented or metallic layer from the foil to the adhesive-bearing areas of the substrate.

Preferably, the heated laminating nip comprises a heated roller and an impression roller. However, it is also possible for the heated laminating nip to comprise a heated platen and an impression bed. The impression roller or bed may or may not be heated.

When the heated laminating nip comprises a heated roller and an impression roller, the foil and substrate are preferably fed at the same line speed through the heated laminating nip with the foil layer to the side of the heated roller and the substrate to the side of the impression roller.

As explained above, it is possible for the pathway of the substrate to be such that, subsequent to the curing step, and prior to the heating and transferring steps, the substrate is passed around a redirecting means (such as a turner bar or the like) that directs the pathway of substrate towards a station in which the heating and transferring steps take place.

The adhesive may be applied to the substrate by any known means, including flexography, lithography and letter press printing techniques.

According to the present invention there is also provided an apparatus for the application of a pigmented or metallic layer from a foil to a substrate comprising:
  (i) means for applying an adhesive to the substrate;
  (ii) means for curing the adhesive;
  (iii) means for heating the substrate bearing the cured adhesive to render the adhesive tacky; and
  (iv) means for transferring the pigmented or metallic layer from the foil to the adhesive-bearing areas of the substrate.

According to the present invention there is also provided an adhesive comprising:
  (i) a thermoplastic resin;
  (ii) a polymerisable component; and
  (iii) a chain terminating agent that controls the extent of chain length growth of the polymerisable component, wherein the ratio of polymerisable component to chain terminating agent is such that the adhesive is capable of being cured to a substantially non-tacky state, and is capable of being made tacky after curing on the application of heat.

Preferably, the thermoplastic resin is a low melting point thermoplastic resin, preferably having a melting point of between 80 and 130° C.

Whilst any suitable thermoplastic resin that softens at the operating temperature of the heating step may be used, it is preferred that the thermoplastic resin comprises a vinyl or ketone resin, preferably having an average molecular weight of between 700 and 10,000.

Preferably, the thermoplastic resin comprises a styrene resin, preferably having a molecular weight of between 700 and 5000. More preferably, the styrene resin has a molecular weight of between 800 and 2200.

The polymerisable component may comprise any typical adhesive monomer component, but preferably is one that forms a polyether on polymerisation.

The adhesive may be curable by any suitable means including solvent or water evaporation, or by the application of ultra-violet light.

In the case of an adhesive that is suitable for curing by ultra-violet light, the polymerisable component may comprise an epoxide such as a cycloaliphatic epoxide, or more preferably a cycloaliphatic epoxide which comprises an epoxycyclohexyl group.

The chain terminating agent is an agent that reacts with the polymerisable component in the curing step in such a way that it can limit the average chain length of the polymer obtained. This in turn controls the melting point of the polymer. It is by the control of the extent of polymerisation in the curing step that it is made possible to cure the adhesive to a substantially non-tacky state and to subsequently make the adhesive tacky by the application of heat.

Preferably, the chain terminating agent comprises a chain transfer agent which, at the same time as "stopping" the growth of one polymer chain, releases a chemical species that will commence the growth of a new polymer chain (such as a hydrogen ion). Preferred chain transfer agents include hydroxyl containing species, and more preferably this contains only one hydroxy group (for example, phenoxyethanol).

In the case of an adhesive composition comprising an epoxide as the polymerisable component, and a hydroxyl-containing species as the chain transfer agent that terminates the growth of one chain and commences the growth of a new chain, the reaction mechanism is as described below.

Initiation may be by any known means but in the following example the polymerisation is initiated by ultra-violet light. The initiation reaction opens up the epoxide ring of the epoxide monomer and the chain reaction proceeds via ring opening of each subsequent epoxide group.

1. Initiation

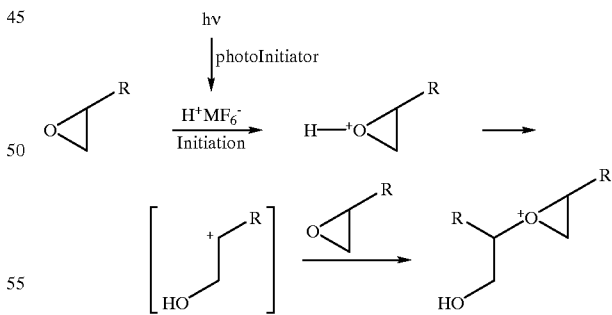

2. Chain Reaction

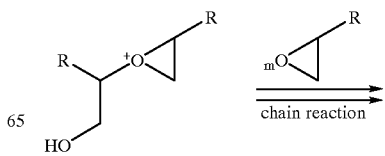

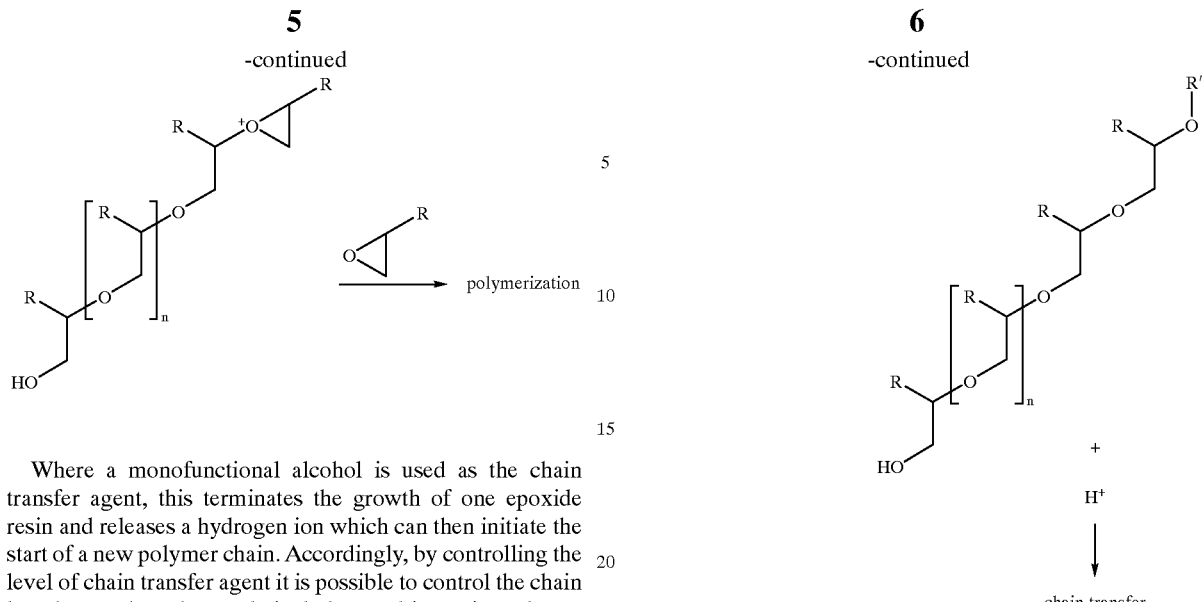

Where a monofunctional alcohol is used as the chain transfer agent, this terminates the growth of one epoxide resin and releases a hydrogen ion which can then initiate the start of a new polymer chain. Accordingly, by controlling the level of chain transfer agent it is possible to control the chain length growth so that a relatively low melting point polymer may be obtained.

Polyols are not desired chain transfer agents, since polyols result in the cross-liking of multiple polymer chains, thereby increasing the chain length, molecular weight and melting point of the resultant polymer. Accordingly it is preferred that the adhesive be substantially free of polyols. By "substantially free" it is meant that the adhesive should not contain such levels of polyols that it is not possible to obtain an adhesive that can be cured and subsequently softened on heating to render the adhesive tacky. The chain transfer agent should preferably be monofunctional in the sense that each molecule of chain transfer agent terminates one polymer chain only.

3. Chain Transfer

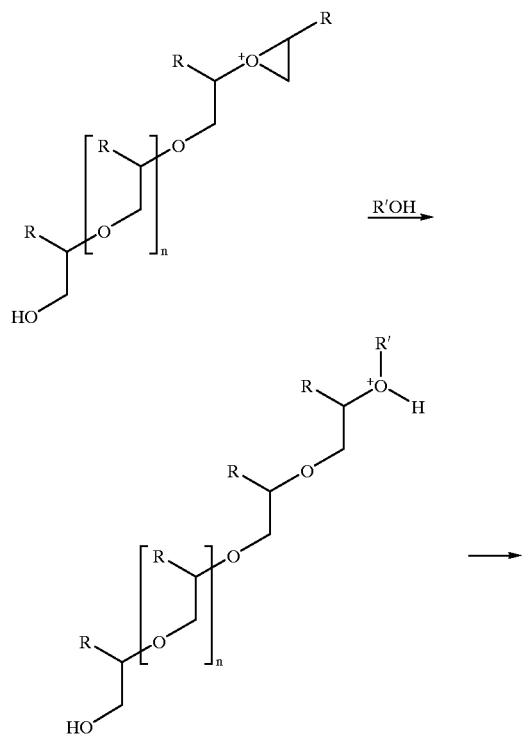

Chain termination can occur by neutralisation of the cationic species by an anionic species.

4. Chain Termination

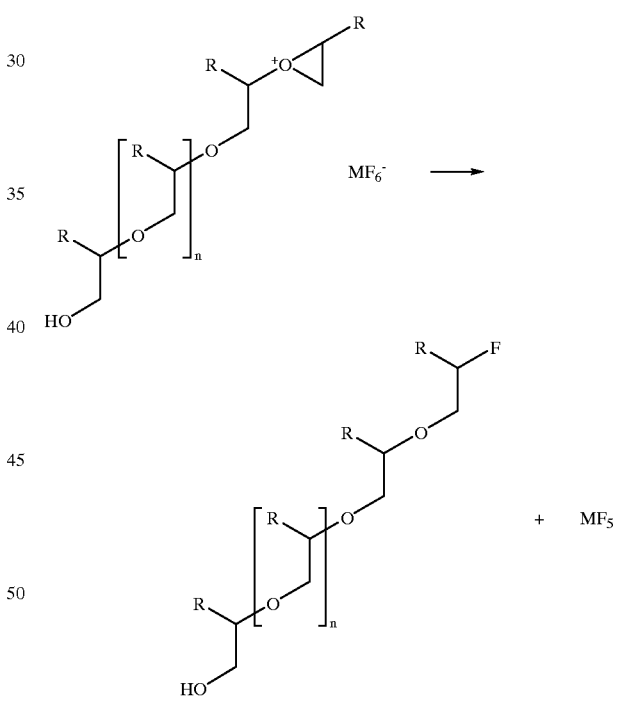

Preferably, the adhesive comprises an initiating agent that can initiate the polymerisation of the polymerisable component upon irradiation with ultra-violet light, such as an onium salt, or more particularly a triaryl sulphonium salt.

Preferably, the molar ratio of polymerisable component to chain transfer agent is from 1:1 to 5:1, more preferably from 1:1 to 3:1.

Preferably, the thermoplastic resin is present up to a level of 40% by weight and preferably at a minimum level of 10% by weight.

According to the present invention there is also provided a method for adapting a continuous hot stamping printing apparatus so as to be suitable for use in dieless foiling, said printing apparatus comprising:

a plurality of ink printing stations for the application of ink to a substrate;

means for curing or drying the ink layers;

a foil application station for the application of the foil to the substrate by means of heat and pressure comprising either an engraved die and impression roller or bed; and redirecting means disposed between the curing or drying means and the foil application station around which the substrate is passed to direct the substrate towards the foil application station;

said method comprising:

either using one of the ink printing stations as an adhesive printing station which serves to apply adhesive to the substrate, or adding a further printing station for the application of adhesive to the substrate; and replacing the engraved metallic die with a substantially smooth heated roller or platen.

BRIEF DESCRIPTION OF THE DRAWINGS

The present invention will now be explained in further detail with reference to the accompanying illustrations in which.

DETAILED DESCRIPTION OF THE PREFERRED EMBODIMENT

Figure 1:
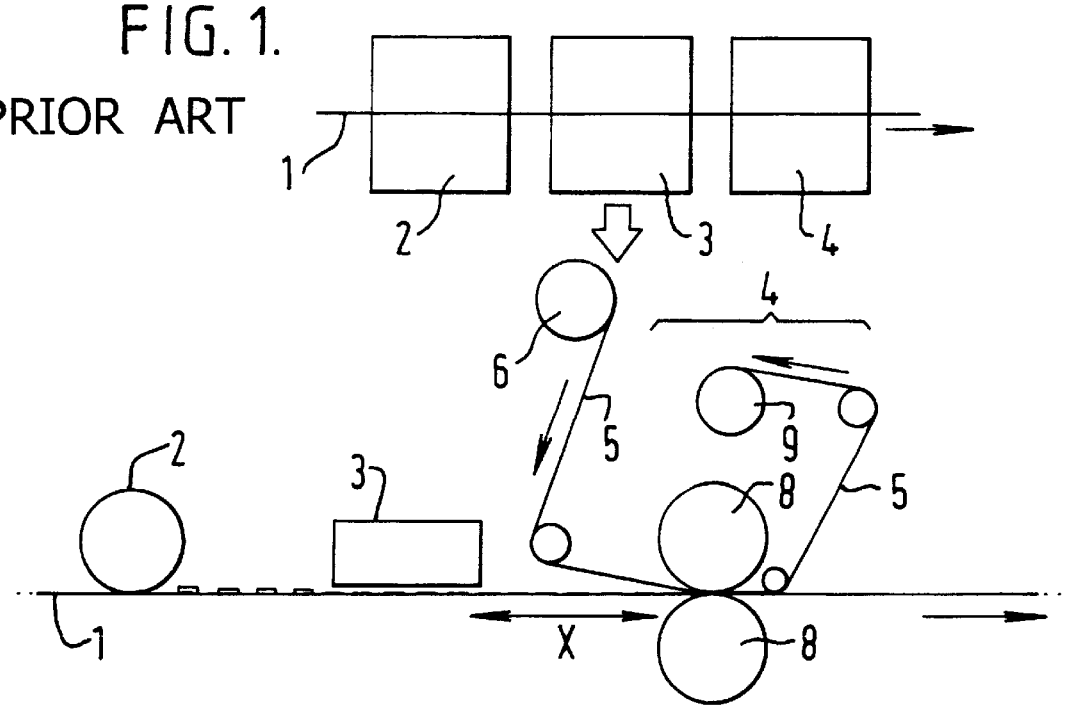
FIG. 1 schematically illustrates a cold foiling system of the prior art.

FIG. 1 illustrates an apparatus for cold foiling in accordance with the prior art. According to this technique, adhesive is applied to a substrate 1 at a printing station 2 by flexography. The substrate bearing the adhesive passes to a UV drying station 3 where the wet adhesive formulation is activated by the application of ultra-violet light. The ultra-violet light initiates polymerisation of the monomer components of the adhesive. In the time it takes the adhesive on the substrate to pass distance X illustrated in FIG. 1 to a foiling station 4, the adhesive has reached the desired state of tackiness to enable application of the metallic or pigmented layer of a foil 5 to the substrate 1. The foil 5 is unwound from a foil unwind spool 6 at the same line speed as the line speed of the substrate 1. The foil 5 passes, together with the substrate 1, through a laminating nip comprising two pressure rollers 8 where the metallic or pigmented layer of the foil 5 is removed from a carrier layer of the foil in a pattern corresponding to the areas of adhesive on the substrate 1. The spent foil is rewound onto spent foil rewind spool 9.

Figure 2:
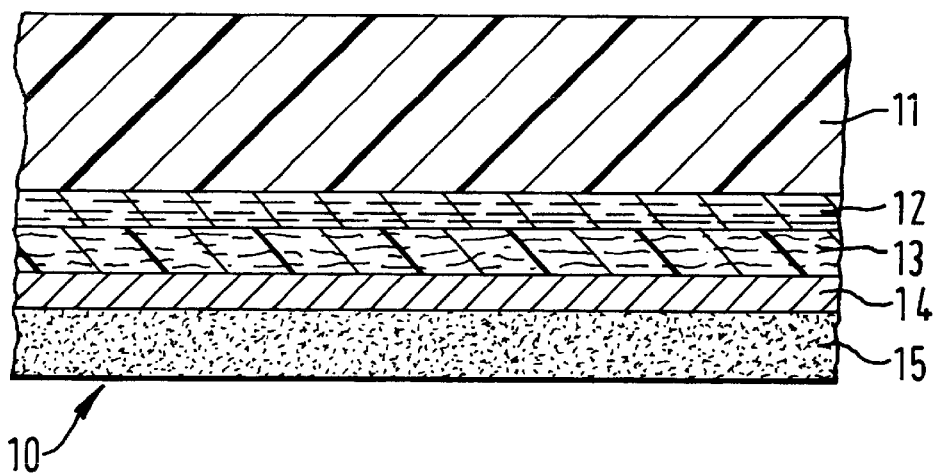
FIG. 2 illustrates a typical foil construction suitable for use in the apparatus and method of the present invention.

A typical foil construction 10 suitable for use in the present invention is illustrated in FIG. 2. The foil 10 comprises a polyester carrier layer 11 carrying a wax-based release layer 12. To the underside of the release layer 12 there is applied in sequence a lacquer layer 13, a metallic layer 14 and finally a layer of adhesive 15. The adhesive layer is not present in all foils, however its presence is not detrimental to the operation of the present invention, and indeed, the preferred embodiments have been performed using a foil having this layer.

Figure 3:
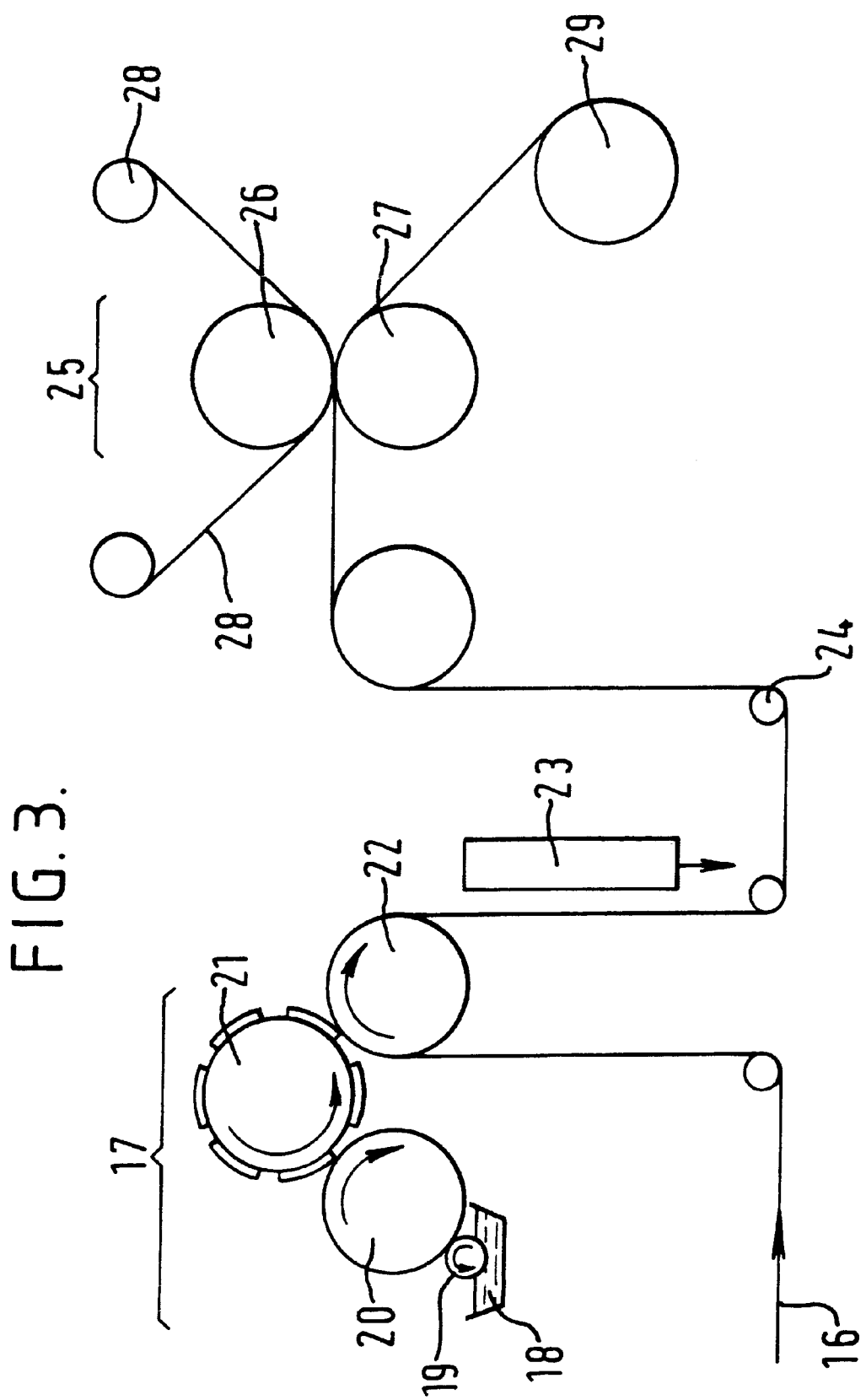
FIG. 3 schematically illustrates an apparatus in accordance with one preferred embodiment of the present invention.

In accordance with a preferred embodiment of the invention illustrated schematically in FIG. 3, a substrate 16 in the form of a continuous web of paper, board or other heat resistant substrate, which has passed through a series of ink printing stations (not illustrated) is passed through an adhesive printing station 17. At the adhesive printing station 17, adhesive from tray 18 is picked up by an adhesive feed roller 19 and transferred to an anilox gravure roller 20. Adhesive from the anilox gravure roller 20 is supplied to the raised area on the cylindrical flexographic plate 21. The adhesive on the flexographic plate comes into contact with the substrate 16 which passes over a roller 22 which presses against the flexographic plate. The substrate 16 then passes to a station where there is provided means for curing the adhesive, in the form of an ultra-violet light source 23. The ultra-violet light source-cures the adhesive on the substrate by initiating polymerisation of the polymerisable component. The substrate 16 then passes around a re-directing means in the form of a turner bar 24 and progresses towards a foiling station 25. The foiling station comprises means for heating the substrate bearing the cured adhesive to render the adhesive tacky, and means for transferring the pigmented or metallic layer from the foil to the adhesive-bearing areas of the substrate in the form of a heated laminating nip which comprises a heated roller 26 and an impression roller 27. The heated roller 26 is maintained at a temperature of between 140 to 200° C., and usually at a temperature of approximately 160 ° C. The impression roller is not heated.

The foil 28 and substrate 16 are fed through the laminating nip at the same line speed. This will usually be at least 40 meters per minute. With the substrate 16 and foil 28 moving at this speed through the laminating nip, and with the temperature of the heated roller at approximately 160° C., it has been found that the temperature of certain adhesives are raised to between 80 and 120° C. (usually approximately 100° C.) in order to render the adhesive tacky. The tacky, adhesive-bearing areas of the substrate will pull away the metallic or pigmented areas of the foil from the carrier layer of the foil. Spent foil is rewound onto the spent foil rewind spool 28, and the foiled substrate is wound onto the foiled substrate spool 29.

As it will be appreciated by persons skilled in the art of the invention, the apparatus can include one or more ink printing stations in which ink is applied to the substrate. The adhesive printing station may precede or follow the ink printing stations. In addition, since the adhesive is cured to an extent that it is not tacky, it is possible to apply adhesive to the substrate, and to store the substrate either in sheet form or on a reel prior to conducting the heating and transferring steps in which the pigmented or metallic layer of the foil is transferred to the tacky adhesive.

It will also be appreciated by persons skilled in the art of the invention that the method of the present invention enables the simple adaptation of a continuous hot-stamping printing apparatus so as to be suitable for use in dieless foiling. A hot-stamping (rotary or flat) printing apparatus typically comprises a plurality of ink printing stations for the application of ink to a substrate, means for curing or drying the ink layers such as an ultra-violet light source, and a foil application station for the application of foil to the substrate by means of heat and pressure comprising an engraved cylindrical or flat die and an impression roller or impression bed. A typical printing apparatus suitable for adaptation so as to be suitable for use in dieless foiling by the method claimed herein also usually comprises a redirecting means such as a roller disposed between the curing or drying means and the foiling application station around which the substrate is passed to direct the substrate towards the foil application station. In order to adapt this printing apparatus so as to be suitable for use in dieless foiling, one of the ink printing stations is used as an adhesive printing station which serves to apply adhesive to the substrate, or alternatively, a further printing station for the application of adhesive to the substrate is added to the printing apparatus, and the engraved die is replaced with a substantially smooth heated roller or platen.

The adhesive of the present invention will now be described in further detail by reference to the following Examples.

EXAMPLE 1

The adhesive used in accordance with a preferred embodiment of the invention comprises the following components:

| Component | Function | wt % in flexogaphic application | wt % in letter press application | Typical range wt % |
|---|---|---|---|---|
| CYRACURE 6110 ™ | polymerisable component; epoxide | 39.3 | 44.3 | 30–50 |
| KRISTALEX F100 ™ | thermoplastic resin; styrene resin | 20 | 30 | 10–40 |
| phenoxyethanol | chain transfer agent | 20 | 20 | 10–30 |
| pigment |  | 0.5 | 0.5 |  |
| triaryl sulphonium hexafluoro phosphate solution | initiator | 5.0 | 5.0 |  |
| other additives |  | 15.2 | 0.2 |  |

The adhesives set out in the above table were found to be suitable for the application of a foil of the type set out British Patent Application No. 9505606.5 (publication number 2299035).

The adhesives set out above can be cured by irradiation with ultra-violet light to the extent that the cured adhesive is not transferred onto the turner bar 24 of FIG. 3 which impinges on the pathway of the substrate between the curing station and the foiling station. The adhesive becomes tacky when heated to approximately 100° C. However, by modifying the formulation (by changing the components or quantities in the composition) the temperature at which the adhesive becomes tacky can be modified to be suitable for use in a particular application.

What is claimed is:

1. A process for the mechanical application of a pigmented or metallic layer from a foil to a substrate comprising:

(i) applying through an apparatus an adhesive to the substrate;

(ii) curing the adhesive at a station of the apparatus;

(iii) heating the substrate bearing the cured adhesive to render the adhesive tacky at a station of the apparatus; and (iv) subsequently transferring the pigmented or metallic layer from the foil to the adhesive-bearing areas of the substrate at a station of the apparatus.

2. The process as claimed in claim 1, wherein in step (ii) the adhesive is cured to the extent that the cured adhesive is not transferred to any parts of an apparatus upon which the process is conducted that impinge on the pathway of the substrate between the curing step and the heating step.

3. The process as claimed in claim 1, wherein the curing step is effected by irradiation with ultra-violet light.

4. The process as claimed in claim 1, wherein steps (iii) and (iv) are conducted substantially simultaneously.

5. The process as claimed in claim 4, wherein the substrate and foil is passed through a heated laminating means which effects heating of the adhesive to render the adhesive tacky and which effects the transfer of the pigmented or metallic layer from the foil to the adhesive-bearing areas of the substrate.

6. The process as claimed in claim 5, wherein the heated laminating means comprises a laminating nip including a heated roller and an impression roller.

7. The process as claimed in claim 6, wherein the foil and substrate are fed at the same line speed through the heated laminating nip with the foil layer to the side of the heated roller and the substrate to the side of the impression roller.

8. The process as claimed in claim 5, wherein the heated laminating means comprises a heated platen and an impression bed.

9. The process as claimed in claim 1, wherein the pathway of the substrate is such that, subsequent to the curing step, and prior to the heating and transferring steps, the substrate is passed around a redirecting means that directs the pathway of substrate towards a station in which the heating and transferring steps take place.

10. The process as claimed in claim 1, wherein the adhesive composition is such that, subsequent to curing of the adhesive, the adhesive can be rendered tacky by the application of heat to enable the subsequent transferring and adhering of the pigmented or metallic layer from the foil to the substrate.

11. The process as claimed in claim 1, which comprises the application of one or more ink layers to the substrate prior to or after the application of the adhesive.

12. The process as claimed in claim 1, wherein the adhesive is applied by flexographic or letter press printing techniques.

13. The process as claimed in claim 1, wherein the process is continuous.

* * * * *